US006696726B1

(12) United States Patent
Bencuya et al.

(10) Patent No.: US 6,696,726 B1
(45) Date of Patent: Feb. 24, 2004

(54) VERTICAL MOSFET WITH ULTRA-LOW RESISTANCE AND LOW GATE CHARGE

(75) Inventors: Izak Bencuya, Saratoga, CA (US); Brian Sze-Ki Mo, Stanford, CA (US); Ashok Challa, West Jordan, UT (US)

(73) Assignee: Fairchild Semiconductor Corporation, South Portland, ME (US)

( * ) Notice: Subject to any disclaimer, the term of this patent is extended or adjusted under 35 U.S.C. 154(b) by 0 days.

(21) Appl. No.: 09/640,955

(22) Filed: Aug. 16, 2000

(51) Int. Cl.[7] .............................................. H01L 29/76
(52) U.S. Cl. ...................... 257/330; 257/331; 257/341; 257/342
(58) Field of Search .............................. 257/328–334, 257/341, 342; 438/268–274

(56) References Cited

U.S. PATENT DOCUMENTS

| 4,893,160 A | * | 1/1990 | Blanchard .................. 257/334 |
| 4,914,058 A | | 4/1990 | Blanchard |
| 4,941,026 A | | 7/1990 | Temple |
| 4,967,245 A | | 10/1990 | Cogan et al. |
| 4,992,390 A | | 2/1991 | Chang |
| 5,164,325 A | | 11/1992 | Cogan et al. |
| 5,298,781 A | | 3/1994 | Cogan et al. |
| 5,442,214 A | * | 8/1995 | Yang ........................... 257/328 |
| 5,689,128 A | * | 11/1997 | Hshieh et al. ............... 257/331 |
| 5,770,878 A | | 6/1998 | Beasom |
| 5,801,417 A | * | 9/1998 | Tsang et al. ................. 257/333 |
| 5,879,994 A | | 3/1999 | Kwan et al. |
| 5,895,952 A | * | 4/1999 | Darwish et al. ............. 257/330 |
| 6,057,558 A | * | 5/2000 | Yamamoto et al. ........... 257/77 |
| 6,191,447 B1 | * | 2/2001 | Baliga ......................... 257/330 |

FOREIGN PATENT DOCUMENTS

JP          62-69562          *    3/1987    .......... H01L/29/78

OTHER PUBLICATIONS

Technical Literature from Applied Materials, Farhad Moghadam, "Delivering Value Around New Industry Paradigms," pp. 1–11, vol. 1, Issue 2, Nov. 1999.
Technical Literature from Quester Technology, Model APT–4300 300mm Atmospheric TEOS/Ozone CVD System.
Technical Literature from Quester Technology, Model APT–6000 Atmospheric TEOS–Ozone CVD System.
Technical Literature from Semiconductor Fabtech, Curtis, et al., APCVD TEOS: 03 Advanced Trench Isolation Applications, 9th Edition.
Technical Literature from Semiconductor International, John Baliga, Options for CVD of Dielectrics Include Low–k Maderials, Jun. 1998.
Technical Literature from Silicon Valley Group Thermal Systems, APNext, High Throughput APCVD Cluster Tool for 200 mm/300 mm Wafer Processing.

* cited by examiner

Primary Examiner—Ori Nadav
(74) Attorney, Agent, or Firm—Townsend and Townsend and Crew LLP

(57) ABSTRACT

A vertical trench double-diffused metal-oxide-semiconductor (DMOS) field effect transistor characterized by a reduced drain-to-source resistance and a lower gate charge and providing a high transconductance and an enhanced frequency response.

10 Claims, 9 Drawing Sheets

VERTICAL MOSFET WITH ULTRA-LOW RESISTANCE AND LOW GATE CHARGE

CROSS-REFERENCES TO RELATED APPLICATIONS

A first related application is filed concurrently with the present application as U.S. patent application Ser. No. 09/640,954 in the names of Henry W. Hurst et al., and entitled "A Method of Creating Thick Oxide on the Bottom Surface of a Trench Structure in Silicon" and assigned to the present assignee. A second related application is filed concurrently with the present application as U.S. patent application Ser. No. 09/640,496 in the name of James J. Murphy, and entitled "Selective Oxide Deposition in the Bottom of a Trench" and assigned to the present assignee. Both of these applications are incorporated by reference herein for all purposes.

BACKGROUND OF THE INVENTION

The present invention relates to field effect transistors (FETs) and, in particular, to trench double-diffused metal-oxide-semiconductor (DMOS) transistors and methods of fabricating the same.

Power Metal-Oxide-Semiconductor Field Effect Transistors (MOSFETs) are well known in the semiconductor industry. One type of MOSFET is a double-diffused trench MOSFET, or what is known as a "trench DMOS" transistor. A cross-sectional view of a portion of a typical n-channel trench DMOS transistor 10 is shown in FIG. 1. It should be pointed out that the relative thickness of the various layers are not necessarily drawn to scale.

The trench DMOS transistor 10, shown in FIG. 1, includes an n-type substrate 100 over which a substrate out-diffusion layer 101 is formed. An n-type epitaxial layer 102 is formed over substrate out-diffusion layer 101 and a p-type body layer 108 covers epitaxial layer 102. One or more trenches 109 extend through the body layer 108 and a portion of the epitaxial layer 102. Gate oxide layer 104 lines the sidewalls and bottom of each trench 109 and a conductive material 106, typically doped polysilicon, lines gate oxide layer 104 and fills each trench 109. N+ source regions 110 flank each trench 109 and extend a predetermined distance into body layer 108. Heavy body regions 112 are positioned within body layer 108, between source regions 110, and extend a predetermined distance into body layer 108. Finally, dielectric caps 114 cover the filled trenches 109 and also partially cover source regions 110. Note that trench DMOS transistor 10 also typically includes one or more metal layers, which contact source regions 110, with adjacent metal layers separated by an insulating material. These metal layers are not shown in FIG. 1.

FIG. 2 shows a doping concentration profile, taken along a cross-section labeled "xx" in FIG. 1. Cross section xx is representative of the resistance path 116 that a drain-to-source current, $I_{DS}$, encounters as charge carriers travel from source region 110 to the drain of trench DMOS transistor 10, when trench DMOS transistor is on. The various regions that comprise path 116 are source region 110, body region 108, epitaxial layer 102, substrate out-diffusion layer 101 and substrate 100.

The resistance encountered by $I_{DS}$ due to the presence of these various regions is typically quantified as the drain-to-source resistance, $R_{DS}(on)$. A high drain-to-source resistance, i.e. $R_{DS}(on)$, limits certain performance characteristics of the transistor. For example, both the transconductance, $g_m$, of the device, which is a measure of the current carrying capability of the device (given a certain gate voltage) and the frequency response of the device, which characterizes the speed of the device, are reduced the higher $R_{DS}(on)$ is. Another factor that limits the speed of the trench DMOS transistor is the gate oxide charge, $Q_g$. The higher $Q_g$ is the larger the gate-to-drain overlap capacitance becomes and, consequently, the lower the switching capability of the device becomes.

Because the drain-source voltage is dropped almost entirely across the channel region, which comprises the body and epitaxial layers, the channel length, channel resistance and channel concentration profile are critical characteristics that affect the operating performance of a trench MOSFET. Whereas the absolute values of these characteristics are important, so too is the controllability of their variation. Wide device-to-device variations negatively affect the reproducibility of a device having desired performance capabilities.

SUMMARY OF THE INVENTION

Generally, according to an exemplary embodiment of the present invention a trench DMOS transistor and its method of manufacture is provided. The trench DMOS transistor is characterized by an ultra-low on resistance (i.e., $R_{DS}(on)$) and a low gate charge. The method of manufacture minimizes variations in the transistor characteristics by controlling out-diffusion from the substrate.

In a first aspect of the invention, a trench DMOS transistor is disclosed. In an exemplary embodiment the trench DMOS transistor comprises a substrate having a first conductivity type that embodies a drain layer of the transistor, the substrate having a substrate doping concentration; a substrate out-diffusion layer formed over the substrate, the substrate out-diffusion layer having a first major surface closest to the substrate that has a doping concentration approximately equal to that of the substrate doping concentration and a second major surface having a lower concentration than the substrate doping concentration; a body region having a second conductivity type, which is epitaxially formed over the substrate; at least one trench having a bottom and sidewalls, each trench extending through the substrate out-diffusion layer and the body region; a dielectric material lining the sidewalls and bottom of the at least one trench; a conductive material lining the dielectric material and substantially filling the trenches; and source regions having the first conductivity type positioned next to each trench within the body region.

In a second aspect of the invention, a substrate cap layer is positioned between the substrate and the substrate out-diffusion layer in the trench DMOS transistor described in reference to the first aspect of the invention.

In a third aspect of the invention, the thickness of the dielectric material at the bottom of the trenches is thicker than a thickness of the dielectric material on the sidewalls of the trenches so that improved gate charge performance is realized.

In a fourth aspect of the invention, a method of fabricating a trench DMOS transistor is disclosed. The method comprises providing a substrate having a first conductivity type that embodies a drain layer of the transistor, the substrate having a substrate doping concentration; forming a substrate out-diffusion layer over the substrate, the substrate out-diffusion layer having a first major surface closest to the substrate that has a doping concentration approximately equal to that of the substrate doping concentration and a second major surface having a lower concentration than the substrate doping concentration; forming a body region having a second conductivity type over the substrate; forming one or more trenches through the substrate out-diffusion layer and the body region, each trench having a bottom and sidewalls; forming a dielectric plug at the bottom of each trench; lining the sidewalls and bottom of each trench with a dielectric material; lining the dielectric material with a conductive material and substantially filling the trenches with the conductive material; and forming source regions having the first conductivity type positioned next to each trench within the body region.

In a fifth aspect of the invention, the dielectric plug described in reference to the fourth aspect of the invention is formed either by high density plasma chemical vapor deposition or sub-atmospheric chemical vapor deposition.

A further understanding of the nature and advantages of the inventions herein may be realized by reference to the remaining portions of the specification and the attached drawings.

DESCRIPTION OF THE SPECIFIC EMBODIMENTS

The present invention is directed at a trench MOSFET device, and its method of manufacture, that can be used in applications such as cellular phone power supplies, battery switching. The trench MOSFET of the present invention is defined by a structure having a low drain-to-source resistance, low gate charge and a method of fabrication that minimizes device-to-device variations in operating characteristics by controlling out-diffusion from the transistor substrate.

Figure 3:
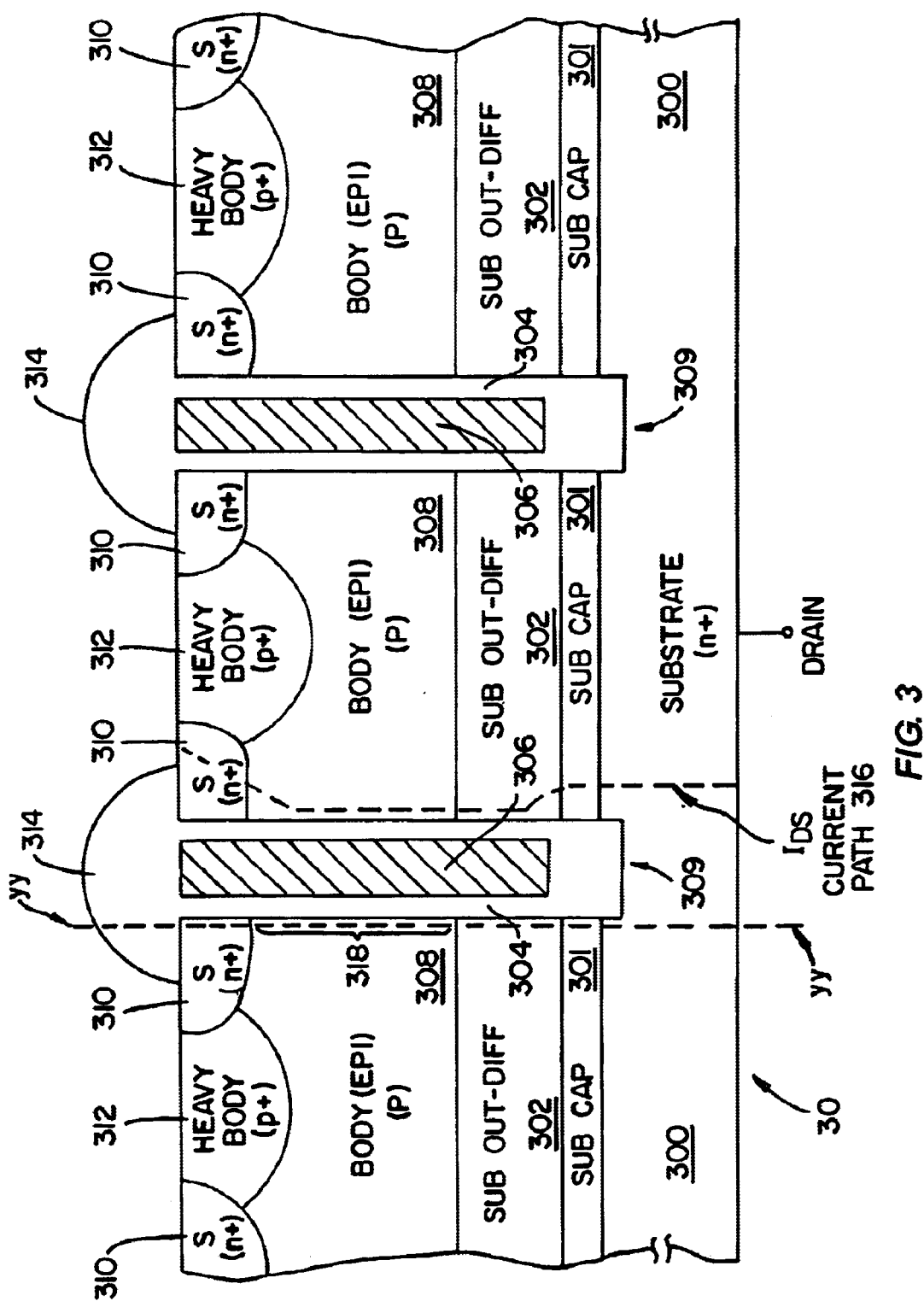
FIG. 3 shows a cross-sectional view of an exemplary n-channel trench DMOS transistor 30 according to one embodiment of the present invention.

FIG. 3 shows a cross-sectional illustration of an exemplary n-channel trench DMOS transistor 30 according to one embodiment of the present invention. Trench DMOS transistor 30 includes an n-type substrate 300, which has a resistivity of, for example, 1–5 mΩ-cm, over which a substrate cap layer 301 is formed. Substrate cap layer 301 is heavily doped and has a resistivity of, for example, 1 mΩ-cm. Substrate cap layer 301 functions to provide a more constant resistivity range than what substrate vendors typically guarantee. For example, substrate vendors typically guarantee that the resistivity of an Arsenic n-type substrate be only somewhere within the range of 1–5 mΩ-cm. As explained below, the more precisely controlled resistivity of substrate cap layer 301, relative to substrate resistivities, ensures a more predictable and stable channel length.

A substrate out-diffusion layer 302 is formed over substrate cap layer 301. Substrate cap layer 301 functions to better control and reduce the channel length of trench DMOS transistor 30 by inhibiting substrate out-diffusion. Better control of the channel length leads to a more predictable and reproducible $R_{DS}$(on), $Q_g$ and breakdown voltage. A p-type body 308 is formed over substrate out-diffusion layer 302. The thickness and resistivity of p-type body are, for example, 4 μm and 0.1 Ω-cm, respectively. One or more trenches 309 extend through the body layer 308, substrate out-diffusion layer 302, substrate cap layer 301 and, preferably, a portion of substrate 300. Gate oxide layer 304 lines the sidewalls and bottom of each trench 309 and a conductive material 306, for example, doped polysilicon, lines gate oxide layer 304 and fills each trench 309. The thickness of gate oxide layer 304 is preferably thicker at the bottom of each trench 309 than on the sidewalls of the trench 309.

N+ source regions 310 flank each trench 309 and extend a predetermined distance into body layer 308. Heavy body regions 312 are positioned within body layer 308, between source regions 310, and extend a predetermined distance into body layer 308. Finally, dielectric caps 314 cover the filled trenches 309 and also partially cover source regions 310.

Trench DMOS transistor 30 also includes one or more metal layers, which contact source regions 310, with adjacent metal layers separated by an insulating material. These metal layers are not shown in FIG. 3.

Figure 1:
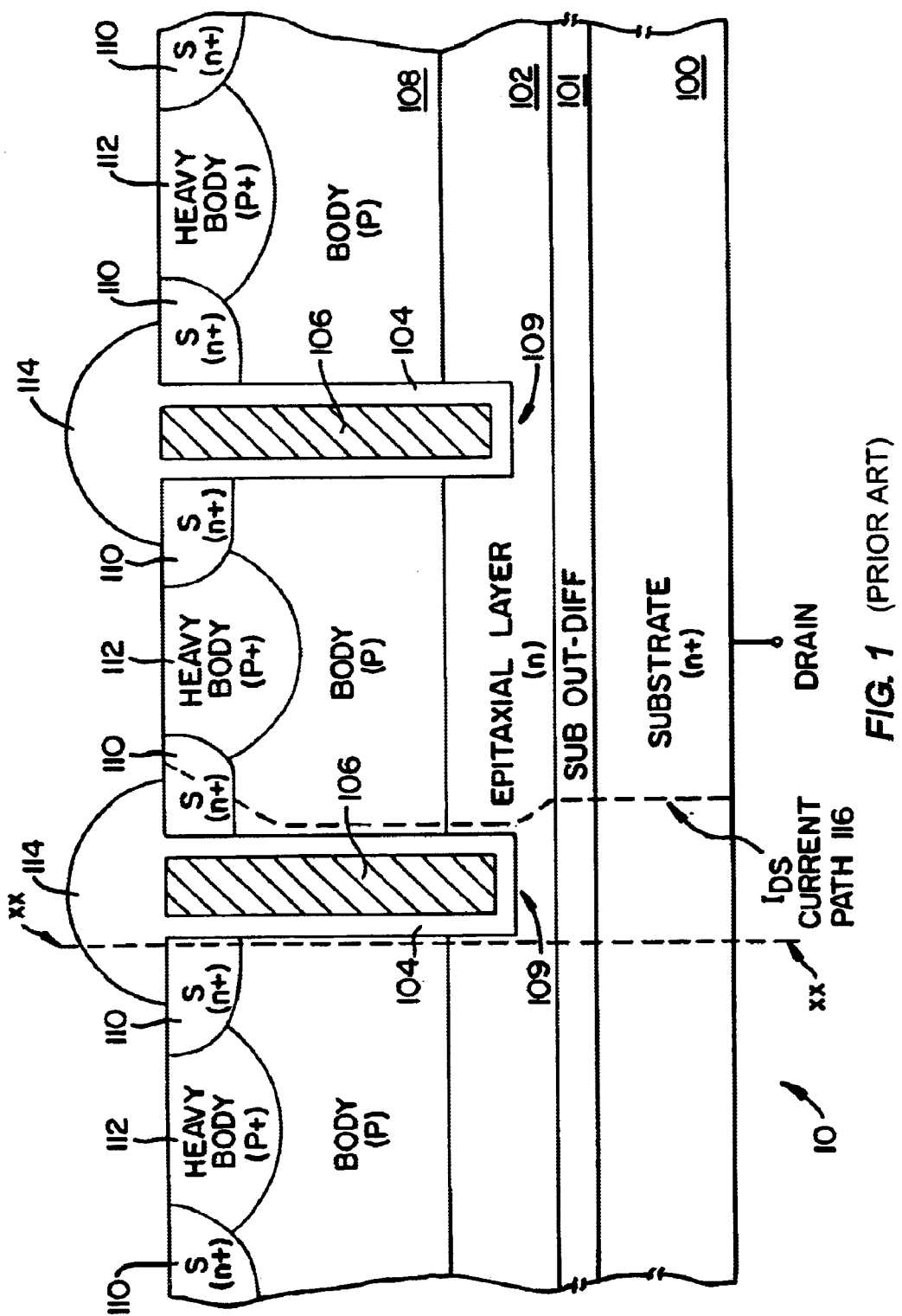
FIG. 1 shows a cross-sectional view of a conventional trench DMOS transistor.
Figure 2:
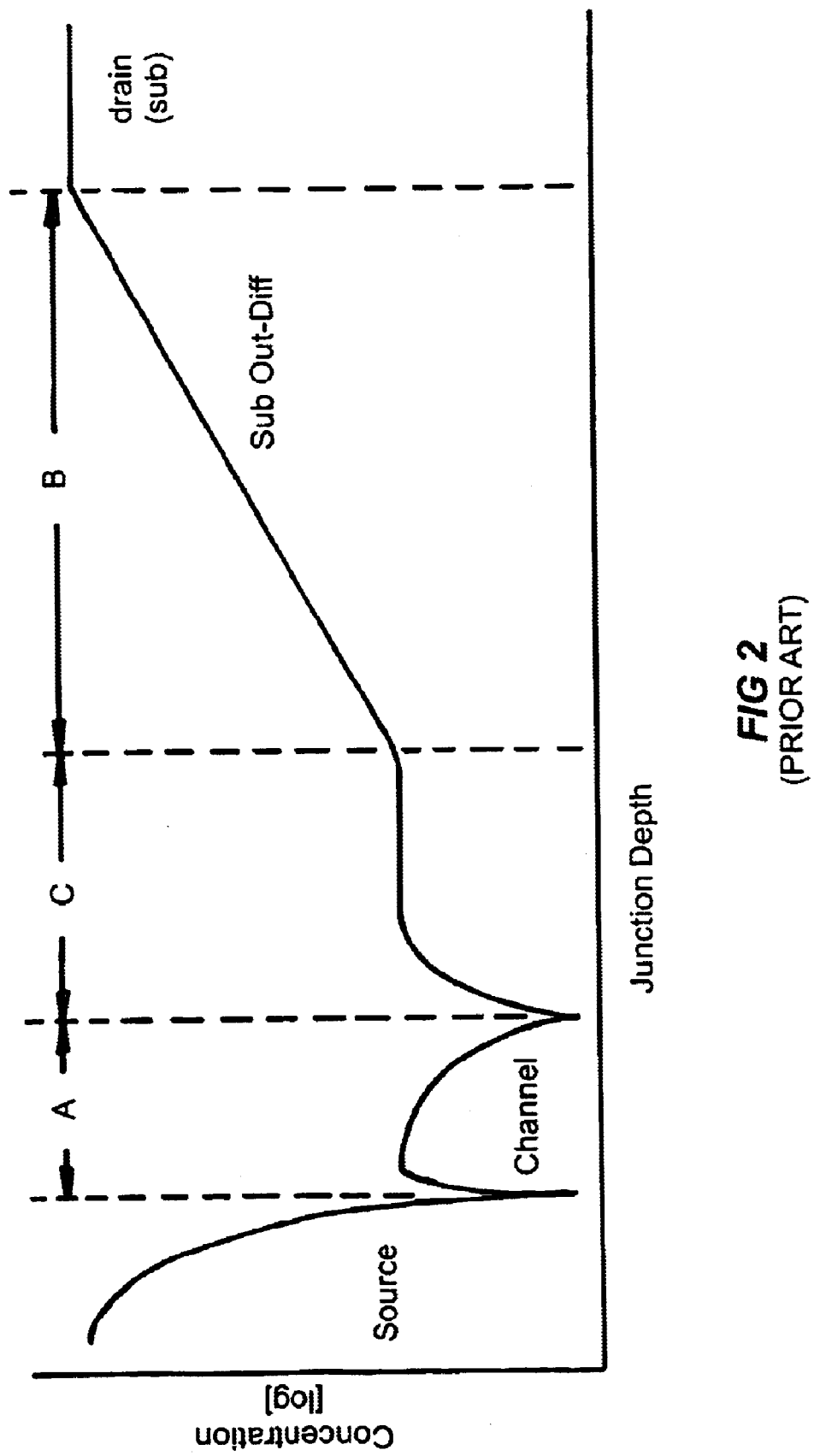
FIG. 2 shows a doping concentration profile, taken along a cross-section labeled "xx" in FIG. 1, of the trench DMOS transistor shown in FIG. 1.

Comparing trench DMOS transistor 30 to the trench DMOS transistor 10 in FIG. 1 reveals some important distinctions. First, as was described above, it is preferred that the thickness of gate oxide layer 304 be larger at the bottoms of each trench 309 than on the sidewalls of each trench 309. The reason for this is that a thicker gate oxide at the bottom trenches 309 alleviates high electric fields in the vicinity of the bottom of trenches 309, thereby providing a higher breakdown voltage, BVdss. The relatively greater thickness also has the effect of reducing the drain overlap capacitance, so that the gate charge, $Q_g$, is reduced.

Second, trench DMOS transistor 30 does not incorporate an n-type epitaxial layer as trench DMOS transistor 10 does (see, layer 102 in FIG. 1). The primary purpose of the epitaxial layer is to provide a region for depletion to avoid reach through. However, while not necessarily limited to, the trench DMOS transistor of the present invention is envisioned to be mainly for low voltage applications. A benefit of the absence of any n-type epitaxial layer in trench DMOS transistor 30 is that a reduced current path is realized so that $R_{DS}$(on) is lowered. As explained above, a lower $R_{DS}$(On) improves certain performance capabilities of the device, which are characterized by, for example, a higher transconductance, $g_m$, and an improved frequency response.

Finally, body 308 is formed by epitaxial deposition, as compared to an implant/diffusion process as used in the manufacture of the trench DMOS transistor shown in FIG. 1. The diffusion step in the manufacture of a trench DMOS is typically performed at high temperature and operates to drive all junctions, including the substrate out-diffusion layer 102, for example, in the trench DMOS transistor shown in FIG. 1. A typical diffusion cycle used in the manufacture of the trench DMOS transistor 10 of FIG. 1 can result in a substrate out-diffusion layer thickness of over 2 μm. Because a diffusion cycle is not required for forming body 308 of trench DMOS transistor 30, the thickness of substrate out-diffusion layer 302 can be made much thinner, for example approximately less than or equal to 1 μm. Moreover, for a given channel length, channel 318 can hold more charge than that of a conventional trench DMOS transistor having a body formed using an implant/diffusion process. Because the channel 318 of trench DMOS transistor 30 can hold more charge, it is less likely that drain-to-source punch-through will occur. Hence, the channel length of channel 318 of trench DMOS 30 can be reduced. The reduction in length of channel 318 and substrate out-diffusion layer 302, reduce the overall distance of the drain/source path, so that a lower $R_{DS}(on)$ is realized.

Figure 4:
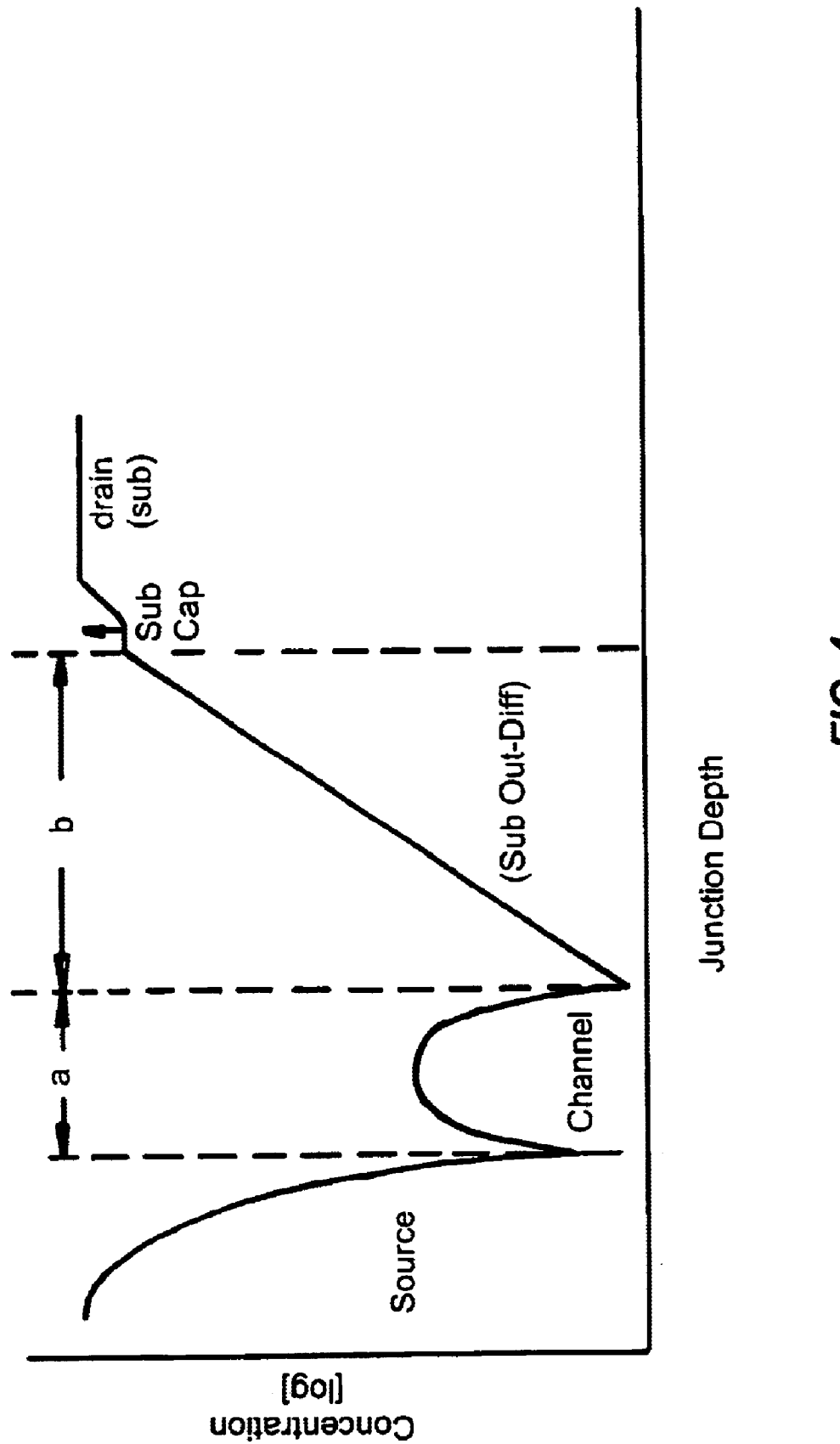
FIG. 4 shows an exemplary doping concentration profile, taken along a cross-section labeled "yy" in FIG. 3, of the trench DMOS transistor shown in FIG. 3.

Referring now to FIG. 4, there is shown an exemplary doping concentration profile, taken along a cross-section labeled "yy," for the trench DMOS transistor 30 shown in FIG. 3. Comparing this doping profile to the doping profile of a conventional trench DMOS transistor, shows that (1) there is no n-type epitaxial layer used in the trench DMOS transistor 30 of the present invention; (2) the channel length of the trench DMOS transistor 30 of the present invention is shorter; and (3) the substrate out-diffusion layer is shorter and has a steeper concentration gradient for the trench DMOS transistor 30 of the present invention. All of these characteristics have the effect of reducing the overall drain to source current path, thereby making $R_{DS}(on)$ smaller.

Figure 5:
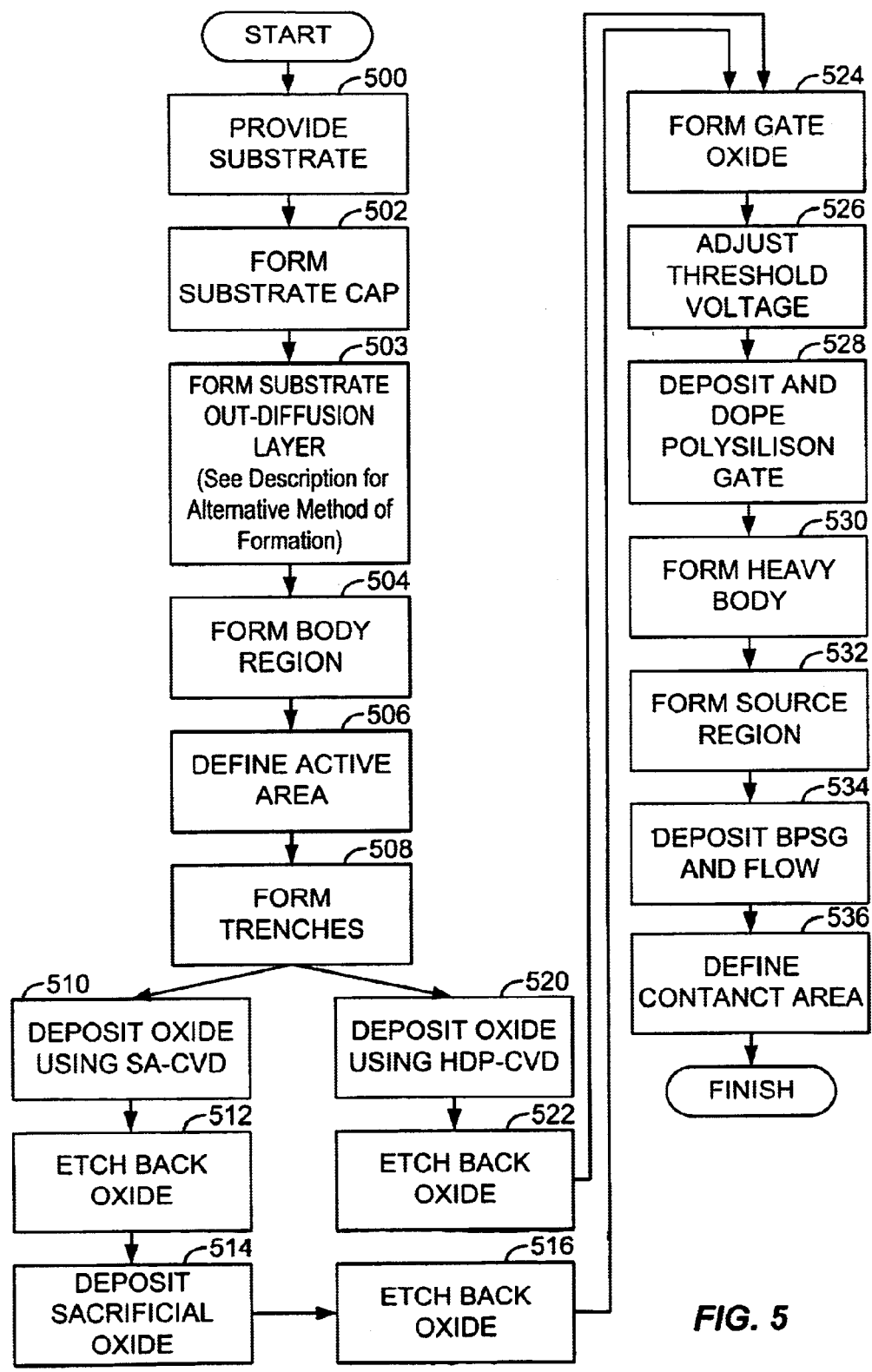
FIG. 5 shows an exemplary process flow, according to another aspect of the invention, for fabricating the trench DMOS transistor shown in FIG. 3.

Referring now to FIG. 5, there is shown an exemplary process flow, according to another aspect of the invention, for fabricating a trench DMOS transistor. This process flow can be used, for example, to fabricate the trench DMOS transistor shown in FIG. 3. The process flow shown in FIG. 5 will now be described in reference to FIGS. 6A through 6K.

Figure 6A:
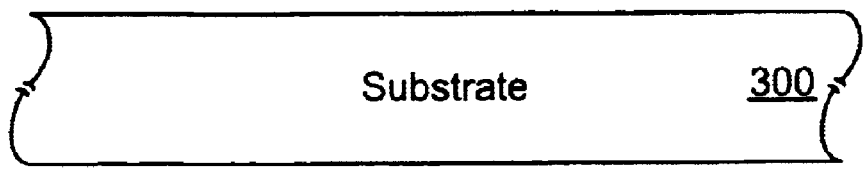
FIGS. 6A–6K show cross-sectional views of the formation of the trench DMOS transistor according to the process flow shown in FIG. 5.
Figure 6B:
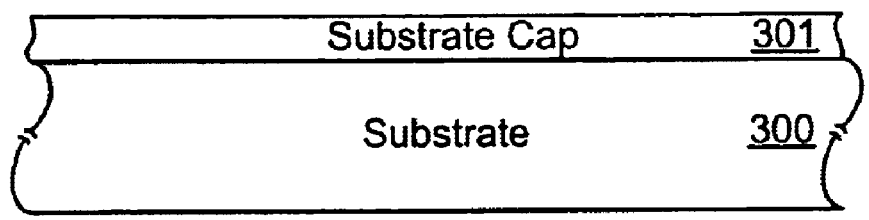

The first step, 500, a substrate 300, having a resistivity of, for example 1 to 5 mΩ-cm is provided. This is shown in FIG. 6A. Next, in step 502, a substrate cap layer 301 is formed over the substrate 300. Substrate cap layer 301 has a resistivity of, for example less than or approximately equal to 1 mΩ-cm and a thickness of approximately 1 μm. The structure following step 502 is shown in FIG. 6B.

Figure 6C:
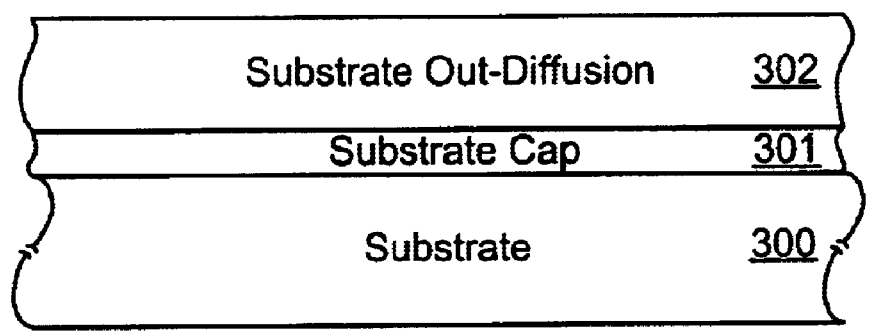
Figure 6D:
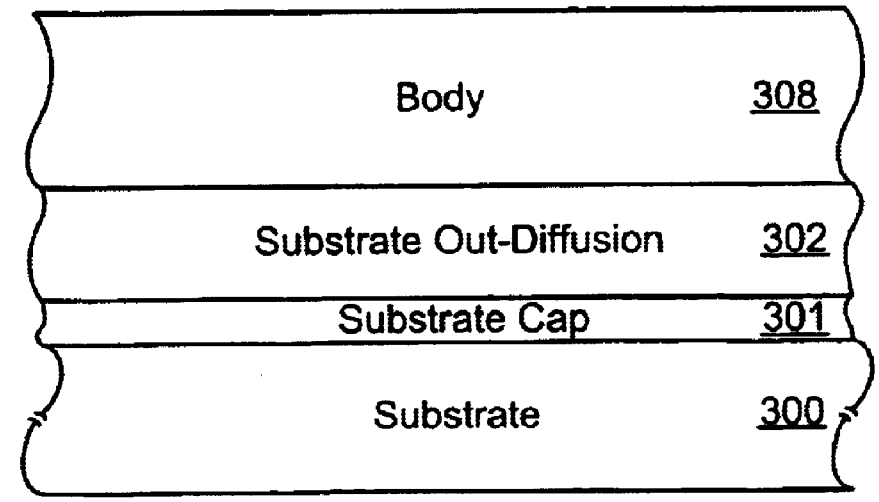

Following formation of cap layer 301 in step 502 a substrate outdiffusion layer 302 is formed over substrate cap layer 301. This is shown in FIG. 6C. In an alternative embodiment, an out-diffusion layer is formed coincidentally as various high-temperature processing steps (e.g. steps 530 and 532 in FIG. 5) are performed later in the fabrication process. In step 504 a p-type body region 308 is formed over substrate out-diffusion layer 302. Body region is formed, for example, using an implant and drive in process, using boron as the dopant with a dose of about 1E12 to 1E15 cm−2. Following the drive in, body region 308 has a depth of approximately 4 μm. The structure following step 504 is shown in FIG. 6D. Next, in step 506 an initial oxide layer is formed over the p-type body region 308, over which an active area of transistor 30 is defined using, for example, standard photolithography.

Figure 6E:
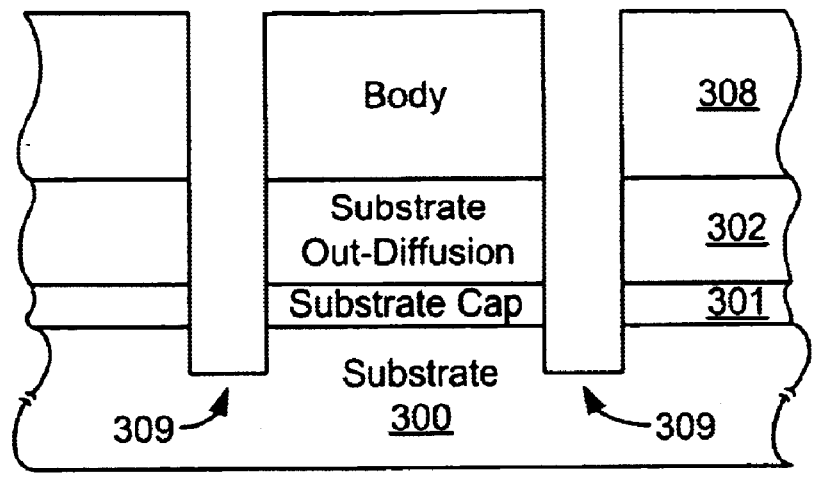

After the active area has been defined, in step 508 trenches 309 are formed. Preferably, an anisotropic etch is used to create trenches 309. The anisotropic etch is in the form of a plasma, which is an almost neutral mixture of energetic molecules, ions and electrons that have been excited in a radio-frequency electric field. Different gases are used depending on the material to be etched. The principal consideration is that the reaction products must be volatile. For etching silicon, the reactants may be, for example, He:$O_2$, $NF_3$ and HBr the pressure may be, for example, 140 mTorr and the duration of the etch may be approximately 3 minutes. In this example, the trenches have a depth of approximately 2.5 μm. As shown in FIG. 6E, each trench 309 extends vertically downward from an exposed surface of body region 308, into and through body region 308, through substrate out-diffusion layer 302, through substrate cap layer 301 and partially into substrate 300.

Figure 6F:
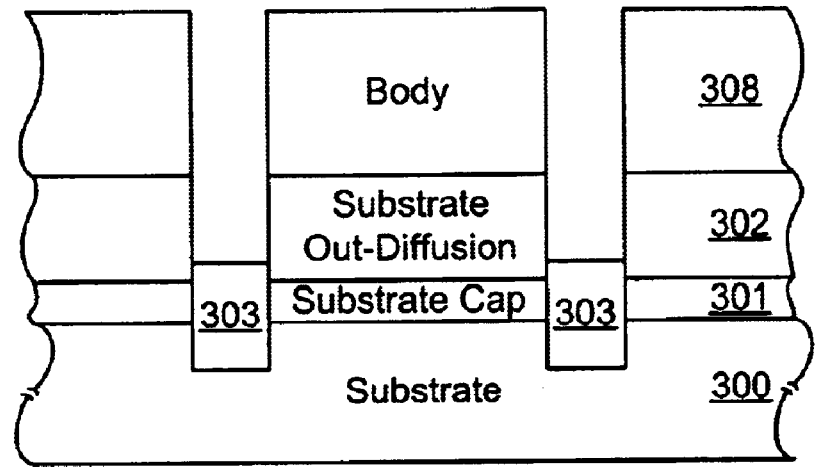

Next in the process, an oxide plug 303 is formed at the bottom of each trench 309. These oxide plugs 303 can be formed in a variety of ways. In a first embodiment of the invention to this regard, in step 510, sub-atmospheric chemical vapor deposition (SA-CVD) is used to deposit oxide on the sidewalls, bottom and over the upper and lower corners of each trench 309. Then, in step 512, the oxide is etched back so that only an oxide plug 303 remains at the bottom of each trench 309. At this stage in the process a sacrificial oxide, having a thickness of about 500 Å may be deposited (step 514) and then stripped (step 516) to prepare the trench sidewalls for a gate oxide. These sacrificial oxide and strip steps are optional. The oxide plug 303 can be alternatively formed using a process known as high-density plasma chemical vapor deposition (HDP-CVD). Using this process, in step 520, oxide is deposited on the sidewalls, bottom and over the upper and lower corners of each trench 309. Then, in step 522, the oxide is etched back using a wet etch to leave an oxide plug 303 at the bottom of each trench 309. The structure following formation of oxide plugs 303 is shown in FIG. 6F.

Next, in optional step 526, the threshold voltage of the structure can be adjusted by administering a p-type implant having, for example, an energy and dose of 70 keV and 3E13 cm−2, respectively.

Figure 6G:
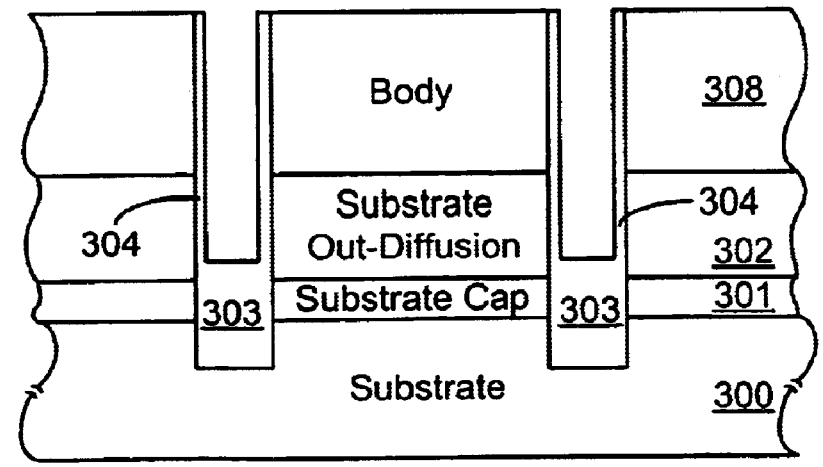
Figure 6H:
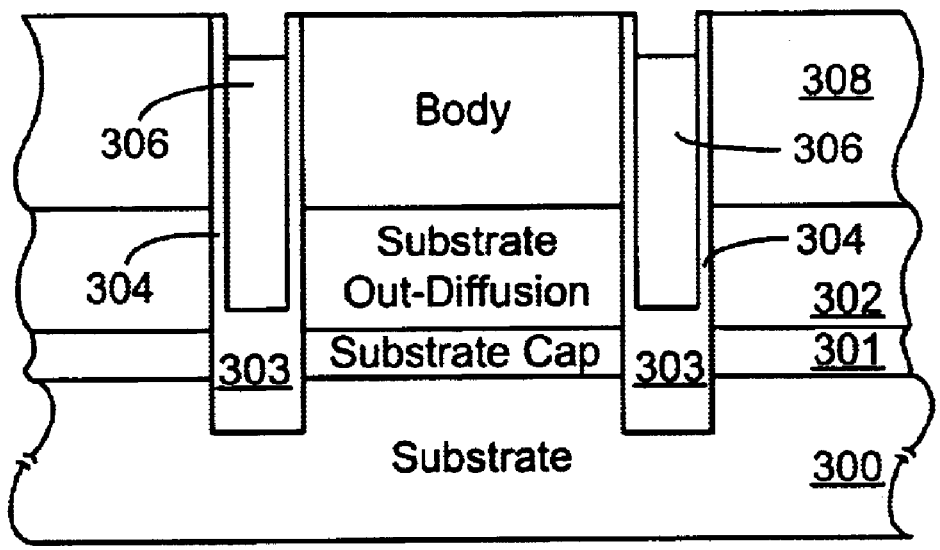
Figure 6I:
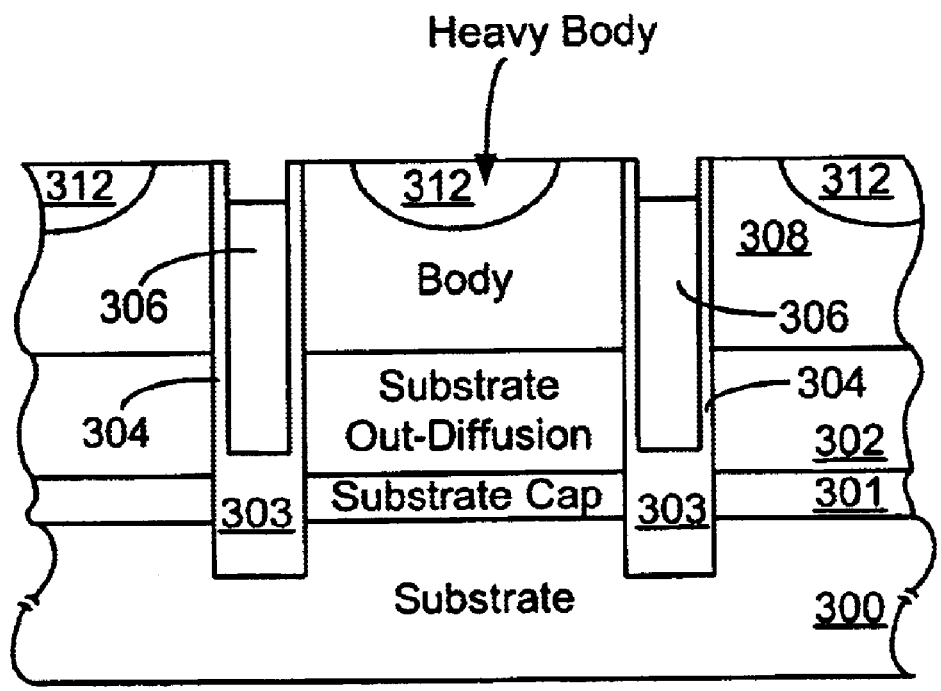

After trenches 309 are formed with the oxide plugs 303, a gate oxide 304 is formed on the sidewalls of trenches 309 as is shown in FIG. 6G. The thickness of gate oxide 304 in this example, is preferably about 200 Å. Following formation of gate oxide 304, in step 528, trenches 309 are lined and filled with polysilicon and then doped using, for example, an n-type implant or by administering a conventional POCL$_3$ doping process. Doping can also be performed using an in-situ process, i.e., as the polysilicon is deposited. The structure following step 528 is shown in FIG. 6H.

Next in another optional step 530, a p+ heavy body region 312 can be formed between adjacent trenches 309. In this example, a surface through which heavy body region 312 is to be formed is defined using, for example, conventional photolithography. Through this surface, two separate p-type (e.g., boron) implants are performed, although in some applications a single implant may be sufficient. In this example, a first implant is performed at a dose and energy of, for example, 2E15 cm−2 and 135 keV, respectively and a second implant is performed at a dose and energy of 5E14 cm−2 and 70 keV, respectively. The primary purpose of the first implant is to bring the depth of heavy body region 312 as deep as is necessary to compensate for the n+ source region, which is formed later in the process. The second implant has a low energy but a high dose. The purpose of this implant is to extend high concentration of the p+ heavy body from the first implant to the surface so that an ohmic contact can be formed. The dose is made high enough to accomplish this but not so high as to overcompensate the n+ source region, which is formed later in the process. In an alternative embodiment, heavy body region can be formed following a contact defining step (step 536), which is performed later in the process.

Figure 6J:
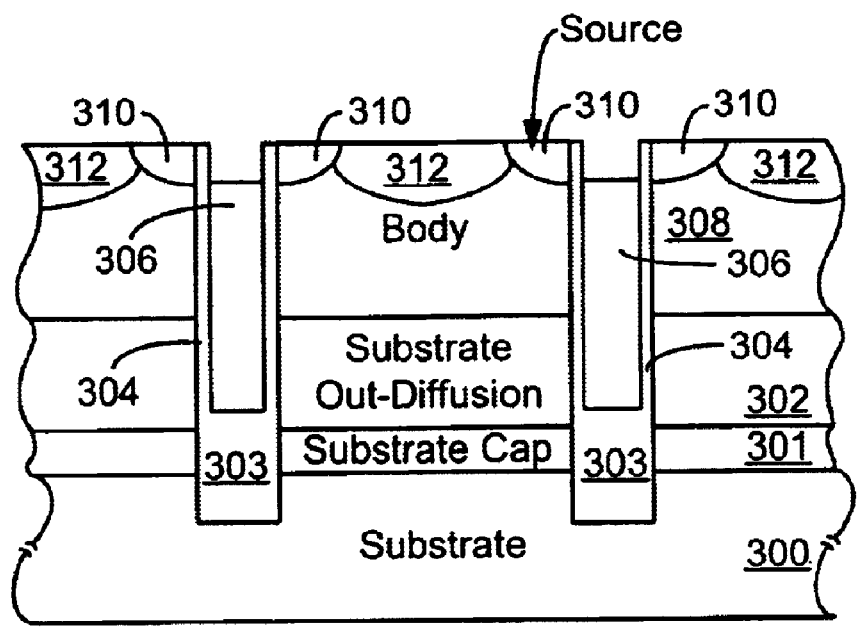

In step 532 a source region 310 is formed. Similar to formation of heavy body region 312, in this example a double implant is used. In this example, a surface through which source region 310 is to be formed is defined using, for example, conventional photolithography. Through this surface, two separate n-type implants are performed, although in some applications a single implant may be sufficient. In this example, a first implant of arsenic is performed at a dose and energy of, for example, 8E15 cm−2 and 80 keV, respectively and a second implant of phosphorous is performed at a dose and energy of 5E15 cm−2 and 60 keV, respectively. The purpose of the first implant is to form a source region 310 and the purpose of the second implant is to extend source region 310 to the surface so that a source contact can be formed. The structure following formation of source region 310 is shown in FIG. 6J.

Whereas the above description described formation of heavy body region 312 prior to the formation of source region 310, in an alternative embodiment the source region could be formed before formation of the heavy body region.

Next, in step 534, an insulating layer, e.g., borophosphosilicate glass, having a thickness in the range of about 5 to 15 kÅ is deposited over the exposed surface of the entire structure. Then the insulating layer is densified or "flowed".

Figure 6K:
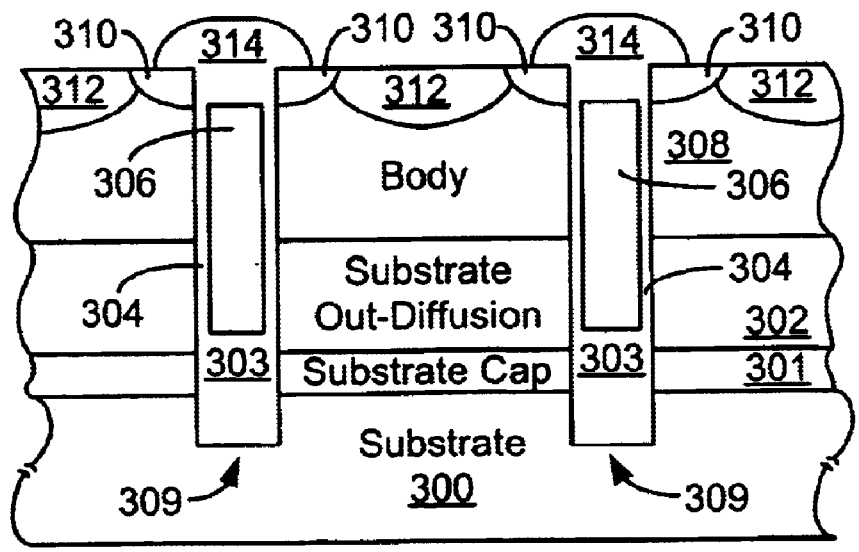

In step 536, the insulating layer is patterned and etched using, for example, standard photolithography, to define electrical contact areas for the trench DMOS structure. As shown in FIG. 6K, the etch is controlled to preserve insulating caps 314 over trenches 309. Following step 536, metallization and passivation steps are performed, although they are not shown in the process diagramed in FIGS. 5 and 6. One skilled in the art would understand, however, what is necessary to perform these steps.

Although the invention has been described in terms of a specific process and structure, it will be obvious to those skilled in the art that many modifications and alterations may be made to the disclosed embodiment without departing from the invention. For example, one of skill in the art would understand that one could begin with a p-type substrate to manufacture a p-channel trench DMOS, which has silicon layer with complementary doping relative to the trench DMOS structure shown in FIG. 3. Also, all of the numbers provided for dimensions, temperatures, doping concentrations, etc. are for illustrative purposes only and may be varied to refine and/or enhance particular performance characteristics of the trench DMOS transistor. Hence, these modifications and alterations are intended to be within the spirit and scope of the invention as defined by the appended claims.

What is claimed is:

1. A trench field effect transistor comprising:

a substrate having a first conductivity type;

a substrate cap layer extending over the substrate;

a substrate out-diffusion region having a first conductivity type extending over the substrate cap layer, the substrate out-diffusion region having a doping concentration which decreases in a substantially continuous manner across the substrate out-diffusion region;

a body region having a second conductivity type, which is epitaxially formed over the substrate cap layer;

at least one trench having a bottom and sidewalls, each trench extending through the substrate out-diffusion region, the substrate cap layer and the body region;

a dielectric material lining the sidewalls and bottom of the at least one trench;

a conductive material lining the dielectric material and substantially filling the at least one trench; and source regions having the first conductivity type positioned next to each trench within the body region.

2. The trench field effect transistor according to claim 1, wherein a thickness of the dielectric material at the bottom of the at least one trench is thicker than a thickness of the dielectric material on the sidewalls of the at least one trench.

3. The trench field effect transistor according to claim 1, wherein the thickness of the dielectric material at the bottom of the at least one trench is thicker than a thickness of the substrate cap layer.

4. The trench field effect transistor according to claim 1, wherein a thickness of the substrate out-diffusion region is less than or equal to one micrometer.

5. The trench field effect transistor according to claim 1 wherein the conductive material extends through a substantial depth of the substrate out-diffusion region.

6. The trench field effect transistor according to claim 1 wherein the dielectric material at the bottom of the at least one trench is a dielectric plug.

7. The trench field effect transistor according to claim 1, wherein the substrate cap layer has the first conductivity type and a doping concentration less than a doping concentration of the substrate.

8. A semiconductor device, comprising:

a substrate of a first conductivity type that forms a drain of the semiconductor device;

a substrate cap layer of the first conductivity type disposed over the substrate and having a lower concentration of dopant than that of the drain;

a substrate out-diffusion region of the first conductivity type extending over the substrate cap layer, wherein a concentration of dopant in the substrate out-diffusion region decreases substantially continuously from a surface of the substrate out-diffusion region at an interface between the substrate out-diffusion region and the substrate cap layer to an opposing surface of the substrate out-diffusion region;

an epitaxially-formed body extending over the substrate cap layer;

a plurality of trenches each having walls and a bottom and extending into the body, the substrate out-diffusion region and the substrate cap layer;

a dielectric layer formed on the walls and bottom of each trench; and a conductive gate disposed within each trench over the dielectric layer.

9. The semiconductor device according to claim 8 wherein the conductive gate in each trench extends through a substantial depth of the substrate out-diffusion region.

10. The semiconductor device according to claim 8, wherein the dielectric layer at the bottom of each trench is a dielectric plug.

* * * * *